United States Patent
Chang et al.

(10) Patent No.: US 9,502,584 B1
(45) Date of Patent: Nov. 22, 2016

(54) VERTICAL DIODE AND FABRICATION METHOD THEREOF

(71) Applicant: VANGUARD INTERNATIONAL SEMICONDUCTOR CORPORATION, Hsinchu (TW)

(72) Inventors: Hsiung-Shih Chang, Taichung (TW); Manoj Kumar, Dhanbad (IN); Jui-Chun Chang, Hsinchu (TW); Chia-Hao Lee, New Taipei (TW); Li-Che Chen, Hsinchu (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 0 days.

(21) Appl. No.: 14/950,572

(22) Filed: Nov. 24, 2015

(51) Int. Cl.
*H01L 29/861* (2006.01)
*H01L 29/66* (2006.01)
*H01L 29/06* (2006.01)
*H01L 29/417* (2006.01)
*H01L 29/45* (2006.01)
*H01L 29/36* (2006.01)
*H01L 21/762* (2006.01)

(52) U.S. Cl.
CPC ....... *H01L 29/861* (2013.01); *H01L 21/76283* (2013.01); *H01L 29/0649* (2013.01); *H01L 29/0684* (2013.01); *H01L 29/36* (2013.01); *H01L 29/417* (2013.01); *H01L 29/45* (2013.01); *H01L 29/66136* (2013.01)

(58) Field of Classification Search
CPC ............ H01L 2924/00; H01L 2924/00014; H01L 2924/0002; H01L 29/872; H01L 29/0619
See application file for complete search history.

(56) References Cited

U.S. PATENT DOCUMENTS 8,835,975 B1 * 9/2014 Veeramma .......... H01L 29/0684
257/107

FOREIGN PATENT DOCUMENTS

TW          201030939 A1    8/2010

* cited by examiner

Primary Examiner — Tony Tran
(74) Attorney, Agent, or Firm — Birch, Stewart, Kolasch & Birch, LLP

(57) ABSTRACT

A vertical diode is provided. The vertical diode includes a high-voltage N-type well region in a substrate, and two P-doped regions spaced apart from each other in the high-voltage N-type well region. The vertical diode also includes an N-type well region in the high-voltage N-type well region, and an N-type heavily doped region in the N-type well region. A plurality of isolation structures are formed on the substrate to define an anode region and a cathode region. There is a bottom N-type implanted region under the high-voltage N-type well region corresponding to the anode region. The bottom N-type implanted region directly contacts or partially overlaps the high-voltage N-type well region. A method for fabricating a vertical diode is also provided.

9 Claims, 6 Drawing Sheets

VERTICAL DIODE AND FABRICATION METHOD THEREOF

BACKGROUND

Field of the Disclosure

The present disclosure relates to a semiconductor device, and in particular it relates to a vertical diode and a method for fabricating a vertical diode.

Description of the Related Art

In general, a diode is composed of P-type semiconductor material and N-type semiconductor material. According to the arrangement of P-type semiconductor material and N-type semiconductor material in the diode, the diodes are classified into two types: the horizontal diode and the vertical diode.

With the same breakdown voltage, the current capacity of the horizontal diode is lower than that of the vertical diode. The current capacity of the horizontal diode may be increased by increasing the effective element area occupied by the horizontal diode. This, however, is undesirable for the scaling down of the semiconductor device.

In order to maintain a high breakdown voltage, the concentration of the dopant in the vertical diode is limited. If the concentration of the dopant is too high, the breakdown voltage will be reduced. However, if the concentration of the dopant is too low, the forward current cannot be significantly increased. Accordingly, in order to increase the forward current and maintain the proper breakdown voltage, there is need in the art for a novel vertical diode and its fabrication method.

BRIEF SUMMARY

The disclosure provides a vertical diode. The vertical diode includes a substrate and a high-voltage N-type well region formed in the substrate. The high-voltage N-type well region extends from a top surface of the substrate downward to a depth and has a first N-type dopant concentration. The vertical diode also includes two P-doped regions formed in the high-voltage N-type well region. The P-doped regions are spaced apart from each other. The vertical diode also includes an N-type well region formed in the high-voltage N-type well region. The N-type well region has a second N-type dopant concentration that is higher than the first N-type dopant concentration. The vertical diode also includes an N-type heavily doped region formed in the N-type well region. The N-type heavily doped region has a third N-type dopant concentration that is higher than the second N-type dopant concentration. The vertical diode also includes a plurality of isolation structures formed on the top surface of the substrate to define an anode region and a cathode region. The anode region exposes the P-doped regions and the high-voltage N-type well region between the P-doped regions. The cathode region exposes the N-type heavily doped region. The vertical diode also includes a bottom N-type implanted region formed under the high-voltage N-type well region corresponding to the anode region. The bottom N-type implanted region directly contacts or partially overlaps the high-voltage N-type well region. The vertical diode also includes an anode electrode and a cathode electrode. The anode electrode is electrically connected to the P-doped regions and the high-voltage N-type well region between the P-doped regions. The cathode electrode is electrically connected to the N-type heavily doped region.

The disclosure provides a method for fabricating a vertical diode. The method includes providing a substrate, forming a bottom N-type implanted region in the substrate, and forming a high-voltage N-type well region in the substrate and on the bottom N-type implanted region. The high-voltage N-type well region extends from a top surface of the substrate downward to a depth and has a first N-type dopant concentration. The method also includes forming an N-type well region in the high-voltage N-type well region. The N-type well region has a second N-type dopant concentration that is higher than the first N-type dopant concentration. The method also includes forming a plurality of isolation structures on the top surface of the substrate to define an anode region and a cathode region. The bottom N-type implanted region under the high-voltage N-type well region corresponds to the anode region. The bottom N-type implanted region directly contacts or partially overlaps the high-voltage N-type well region. The method also includes forming two P-doped regions in the high-voltage N-type well region. The P-doped regions are spaced apart from each other. The method also includes forming an N-type heavily doped region in the N-type well region. The N-type heavily doped region has a third N-type dopant concentration that is higher than the second N-type dopant concentration. The method also includes forming an anode electrode and a cathode electrode. The anode electrode is electrically connected to the P-doped regions and the high-voltage N-type well region between the P-doped regions. The cathode electrode is electrically connected to the N-type heavily doped region.

A detailed description is given in the following embodiments with reference to the accompanying drawings.

BRIEF DESCRIPTION OF THE DRAWINGS

For a more complete understanding of the present disclosure, and the advantages thereof, reference is now made to the following descriptions taken in conjunction with the accompanying drawings, in which.

DETAILED DESCRIPTION

Figure 1A:
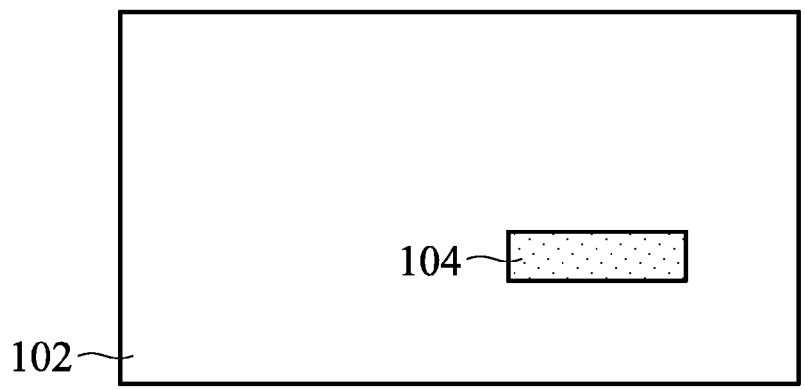
FIGS. 1A-1G show cross-sectional views of various stages of forming a vertical diode in accordance with some embodiments.

The present disclosure is best understood from the following detailed description when read with the accompanying figures. It should be noted that, in accordance with the standard practice in the industry, various features are not drawn to scale. In fact, the relative dimensions of the various features may be arbitrarily increased or reduced for clarity of discussion. In the figures and the specification of the present disclosure, the same reference numerals and/or letters refer to the same components.

The disclosure provides a vertical diode and a method for fabricating the vertical diode. FIGS. 1A-1G show cross-sectional views of various stages of forming a vertical diode 100 in accordance with some embodiments.

Referring to FIG. 1A, the process begins by providing a substrate 102. Then, a first implantation process is performed using an N-type dopant. A bottom N-type implanted region 104 is formed in the substrate 102 by using a photoresist or a hard mask as an implanting mask in the first implantation process. The N-type dopant may include phosphorus (P), arsenic (As), or another applicable N-type dopant.

The substrate 102 may include a bulk semiconductor substrate (such as silicon substrate), a compound semiconductor substrate (such as a group IIIA-VA semiconductor substrate), a silicon-on-insulator (SOI) substrate, or another applicable substrate. The substrate 102 may be a P-type doped substrate, an N-type doped substrate, or an undoped substrate. In some embodiments, the substrate 102 is a P-type doped semiconductor substrate. In some embodiments, the substrate 102 is an N-type doped semiconductor substrate. In this embodiment, the substrate 102 is a P-type doped silicon substrate.

Figure 1B:
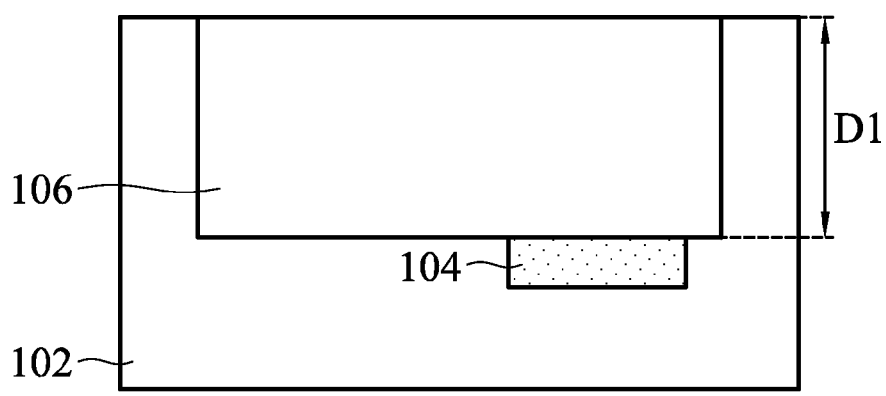

Referring to FIG. 1B, a high-voltage N-type well region 106 is formed in the substrate 102 by performing a second implantation process using an N-type dopant. The high-voltage N-type well region 106 extends from a top surface of the substrate 102 downward to a depth D1 and on the bottom N-type implanted region 104, as shown in FIG. 1B.

If the concentration of the dopant of the high-voltage N-type well region 106 is too high, the breakdown voltage resulting from reversed bias will be reduced. If the concentration of the dopant of the high-voltage N-type well region 106 is too low, the forward current resulting from forward bias will be reduced. In some embodiments, the concentration of the dopant of the high-voltage N-type well region 106 is about $1\times10^{15}$-$1\times10^{17}$ atoms/cm$^3$.

Figure 1C:
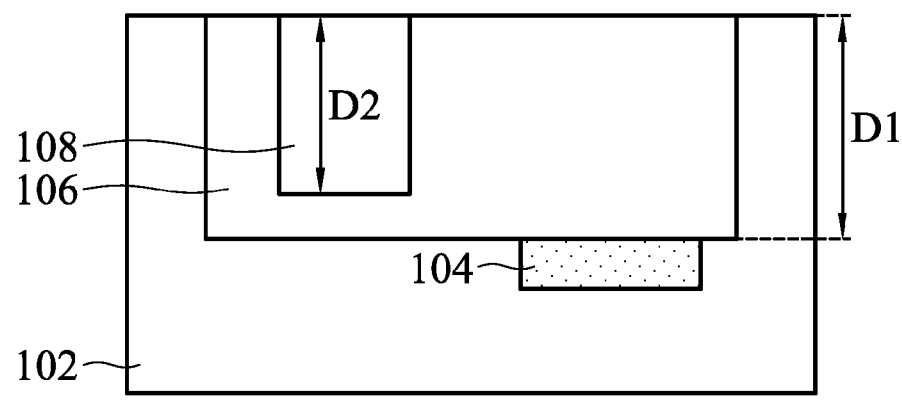

Referring to FIG. 1C, an N-type well region 108 is formed in the high-voltage N-type well region 106 by performing a third implantation process using an N-type dopant. The N-type well region 108 extends from a top surface of the substrate 102 downward to a depth D2, and the depth D2 is smaller than the depth D1 of the high-voltage N-type well region 106, as shown in FIG. 1C.

In order to form an electrically conductive path, the concentration of the dopant of the N-type well region 108 may be greater than the concentration of the dopant of the high-voltage N-type well region 106. However, if the concentration of the dopant of the N-type well region 108 is too high, the breakdown voltage resulting from reversed bias will also be reduced. In some embodiments, the concentration of the dopant of the N-type well region 108 is about $5\times10^{15}$-$5\times10^{17}$ atoms/cm$^3$.

Figure 1D:
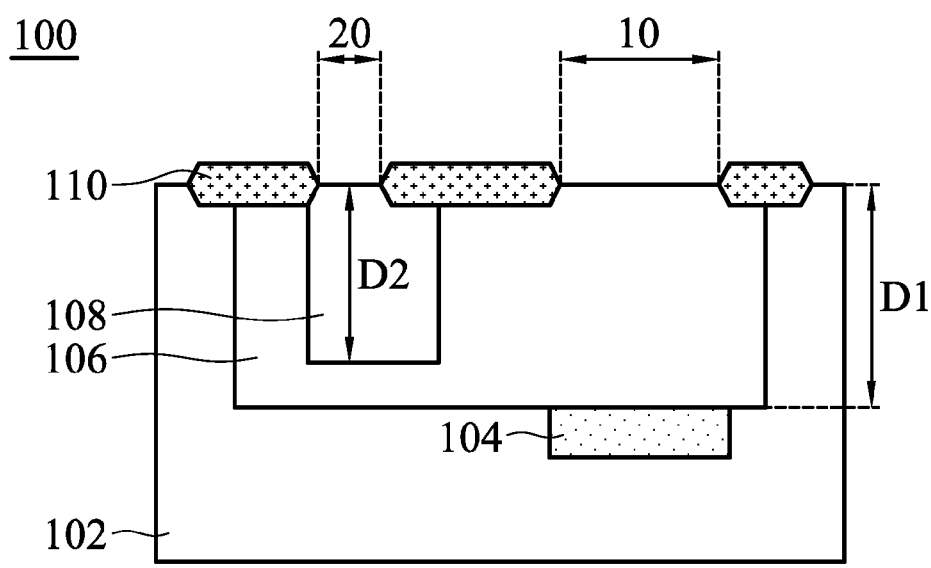

Referring to FIG. 1D, a plurality of isolation structures 110 are formed on the top surface of the substrate 102 to define an anode region 10 and a cathode region 20. In some embodiments, the isolation structure 110 is field oxide, and can be formed by conventional field oxide process. In other embodiments, the isolation structure 110 is a shallow trench isolation (STI) structure. In such embodiments, the isolation structure 110 may be formed by applicable process and may include silicon oxide, silicon nitride, silicon oxynitride, air gap, other applicable material, or a combination thereof. For example, the process for forming the shallow trench isolation (STI) structure may include a photolithography process, an etching process (such as dry etching and/or wet etching) for forming a trench in the substrate, and a deposition process (such as a chemical vapor deposition process) for depositing one or more dielectric materials in the trench.

Figure 1E:
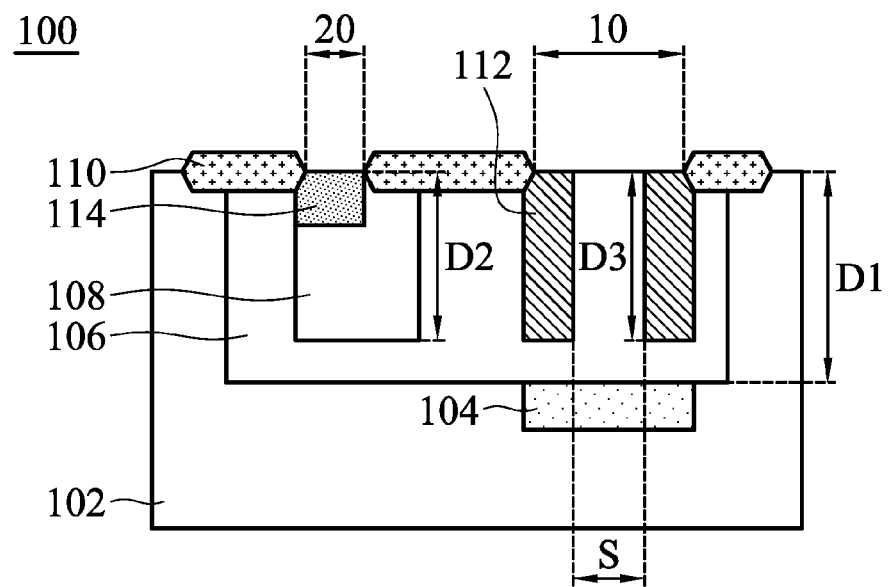

Referring to FIG. 1E, two P-doped regions 112 are formed in the high-voltage N-type well region 106 corresponding to the anode region 10 by performing a fourth implantation process using a P-type dopant. The P-doped regions 112 are spaced apart from each other. The P-type dopant may include boron (B), or another applicable P-type dopant.

As shown in FIG. 1E, the P-doped regions 112 within the anode region 10 are spaced apart by a distance S. Furthermore, the P-doped regions 112 extend from a top surface of the substrate 102 downward to a depth D3. The depth D3 is smaller than the depth D1 of the high-voltage N-type well region 106, and the depth D3 may be equal to or similar to the depth D2 of the N-type well region 108.

It should be noted that the two P-doped regions 112 shown in the cross-sectional views are merely examples and are not intended to be limiting. One skilled in the art would realize that the P-doped regions 112 may include various arrangements in the top view. In some embodiments, the two P-doped regions 112 may be two parallel lines in the top view. In other embodiments, the two P-doped regions 112 may be an enclosed circle or ellipse in the top view. In some embodiments, the two P-doped regions 112 may be an enclosed polygon in the top view.

Referring to FIG. 1E again, an N-type heavily doped region 114 is formed in the N-type well region 108 corresponding to the cathode region 20 by performing a fifth implantation process using an N-type dopant. Similarly, in order to form electrically conductive contact with the subsequent cathode electrode, the concentration of the dopant of the N-type heavily doped region 114 may be greater than the concentration of the dopant of the N-type well region 108. In some embodiments, the concentration of the dopant of the N-type heavily doped region 114 is about $1\times10^{17}$-$5\times10^{19}$ atoms/cm$^3$.

It should be noted that the foregoing sequence of the first, second, third, fourth, and fifth implantation processes is merely an example and is not intended to be limiting. One skilled in the art would realize that the foregoing implantation processes may be performed in other feasible sequences.

Furthermore, in some embodiments, after the first, second, third, fourth, and fifth implantation processes, thermal processes may be independently performed at different temperatures. As a result, the dopant implanted by each implantation process may be properly activated. In some embodiments, the thermal process may be performed after the fifth implantation process. As a result, all dopant implanted by all implantation processes may be activated. The thermal process may include furnace process, rapid thermal process (RTP), other applicable thermal process, or a combination thereof. In some embodiments, the thermal process is a rapid thermal process, the temperature of the thermal process is 850-1000° C., and the duration of the thermal process is 20-90 seconds.

Figure 1F:
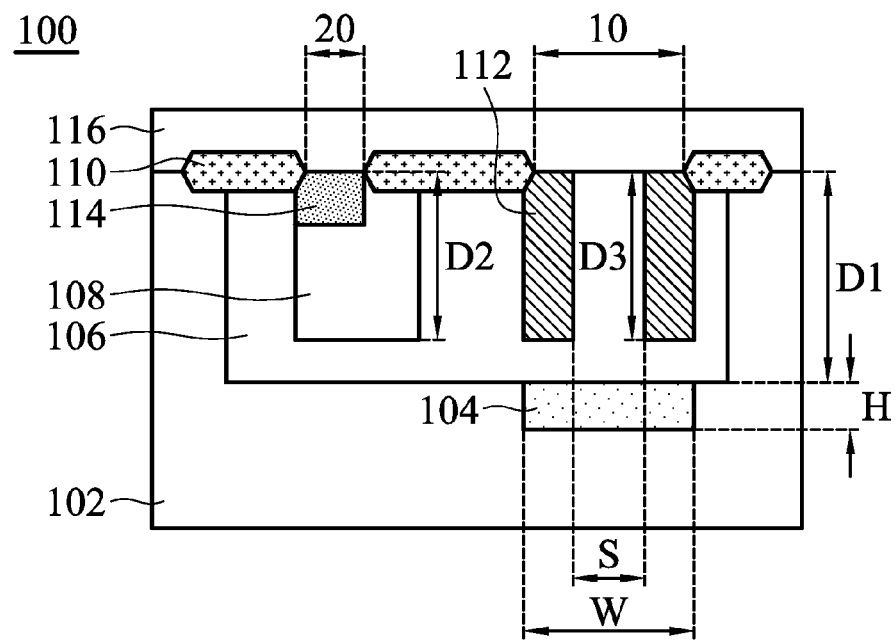

Referring to FIG. 1F, a dielectric layer 116 is formed on the substrate 102. The dielectric layer 116 is made of the following material, including silicon oxide, doped or undoped silicon oxide, undoped silicate glass (USG), phosphorus-doped silicon glass (PSG), boron phosphorus silicate glass (BPSG), (phenyl triethoxy silicate (PTEOS), boron phosphorous tetraethyl silicate (BPTEOS), amorphous fluorinated carbon, parylene, bis-benzocyclobutenes (BCB), polyimide, other applicable porous polymer material and/or a combination thereof. The dielectric layer 116 may be formed by any suitable process, such as chemical vapor deposition (CVD), high density plasma CVD, spin-on process, sputtering, furnace deposition and/or another applicable process.

Figure 1G:
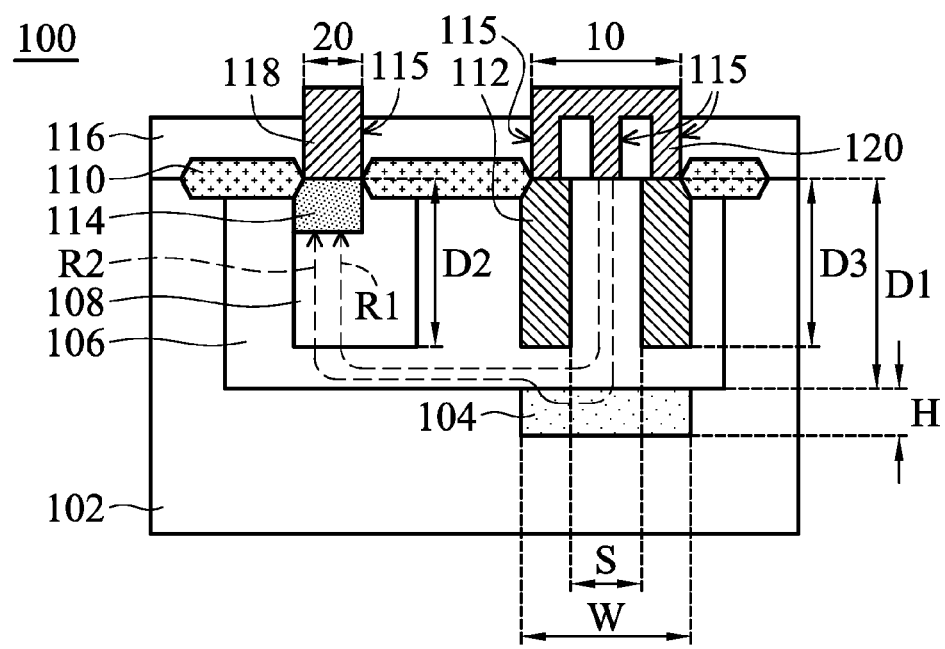

Referring to FIG. 1G, openings 115 are formed in the dielectric layer 116 by photolithography and etching process. As a result, the P-doped regions 112 within the anode region 10 and the high-voltage N-type well region 106 between the P-doped regions 112 are exposed, and the N-type heavily doped region 114 within the cathode region 20 is exposed. After the openings 115 are formed, a conductive material is deposited on the dielectric layer 116 and filled into the openings 115. Then, the conductive material on the dielectric layer 116 is etched back to form an anode electrode 120 in the anode region 10 and a cathode electrode 118 in the cathode region 20 respectively. The anode electrode 120 is electrically connected to the P-doped regions 112 and the high-voltage N-type well region 106 between the P-doped regions 112. The cathode electrode 118 is electrically connected to the N-type heavily doped region 114. In some embodiments, the anode electrode 120 and the cathode electrode 118 may independently comprise tungsten, copper, molybdenum, gold, silver, aluminum, platinum or an alloy thereof.

In this embodiment, the vertical diode 100 may be a Schottky diode which is composed of doped semiconductor material and metal material. In comparison with the conventional vertical diode, the junction barrier at the junction between the doped semiconductor material and the metal material is smaller. Therefore, the turn-on voltage of the Schottky diode is smaller than that of the conventional vertical diode. Furthermore, the Schottky diode produces the electrical current by single carrier movement. Therefore, the switching speed of the Schottky diode is faster than the conventional vertical diode.

Referring to FIG. 1G again, when the forward bias is applied, a charge transfer path R1 passes from the anode electrode 120 through the high-voltage N-type well region 106 between the P-doped regions 112, the high-voltage N-type well region 106 under the P-doped regions 112, the N-type well region 108, and the N-type heavily doped region 114, and finally arrives at the cathode electrode 118.

The inventors of this disclosure discovered that the forward current is significantly increased while an additional bottom N-type implanted region 104 is formed under the high-voltage N-type well region 106. Accordingly, the inventors of this disclosure deduce that while the charges pass through the high-voltage N-type well region 106 under the P-doped regions 112, the bottom N-type implanted region 104 provides an additional charge transfer path R2, as shown in FIG. 1G. In other words, the bottom N-type implanted region 104 expands the charge transfer path, and therefore increases the forward current. It should be noted that the charge transfer paths R1 and R2 shown in FIG. 1G are merely examples and are not intended to limit the number of the charge transfer paths.

Furthermore, the inventors of this disclosure discovered that the position, size, and dopant concentration of the bottom N-type implanted region 104 are important parameters that affect the performance of the vertical diode. The details will be discussed in the following paragraphs.

In order to allow the charges passing through the bottom N-type implanted region 104, the bottom N-type implanted region 104 should be disposed under the high-voltage N-type well region 106 corresponding to the anode region 10, and the bottom N-type implanted region 104 should directly contact or partially overlap the high-voltage N-type well region 106. In some embodiments, when the high-voltage N-type well region 106 is formed, the high-voltage N-type well region 106 directly contacts or partially overlaps the bottom N-type implanted region 104. In other embodiments, when the high-voltage N-type well region 106 is formed, the high-voltage N-type well region 106 has not directly contacted or partially overlapped the bottom N-type implanted region 104 yet. In such embodiments, subsequent thermal process allows the dopant in the high-voltage N-type well region 106 and the bottom N-type implanted region 104 to diffuse outward. As a result, after activated by the thermal process, the doped profiles of the high-voltage N-type well region 106 and the bottom N-type implanted region 104 may directly contact or partially overlap each other.

It should be noted that the dopant concentration of the bottom N-type implanted region 104 is controlled within a desirable range. If the dopant concentration of the bottom N-type implanted region 104 is too low, it is disadvantageous to the charge transfer due to the high electric resistance of the bottom N-type implanted region 104. As a result, the charge transfer path cannot be expanded, and therefore the forward current cannot be increased. In contrast, if the dopant concentration of the bottom N-type implanted region 104 is too high, it is disadvantageous to the depletion of the charge carrier when the reverse bias is applied. As a result, the charge transfer path cannot be shut down when the reverse bias is applied, and therefore the breakdown voltage is significantly reduced. In some embodiments, the N-type dopant concentration of the bottom N-type implanted region 104 is 0.9-1.1 times as great as the N-type dopant concentration of the high-voltage N-type well region 106.

In addition, the width and the height of the bottom N-type implanted region 104 are controlled within a desirable range. Referring to FIG. 1G again, the bottom N-type implanted region 104 has a width W and a height H. If the width W and the height H of the bottom N-type implanted region 104 are too small, the charge transfer path cannot be expanded. Therefore, the forward current cannot be increased. In contrast, if the width W and the height H of the bottom N-type implanted region 104 are too large, the breakdown voltage is significantly reduced when the reverse bias is applied. In some embodiments, the width W of the bottom N-type implanted region 104 is 0.5-2 times as great as a distance S between the P-doped regions 112. In some embodiments, the height H of the bottom N-type implanted region 104 is 5-15% of the depth D1 of the high-voltage N-type well region 106.

Figure 3:
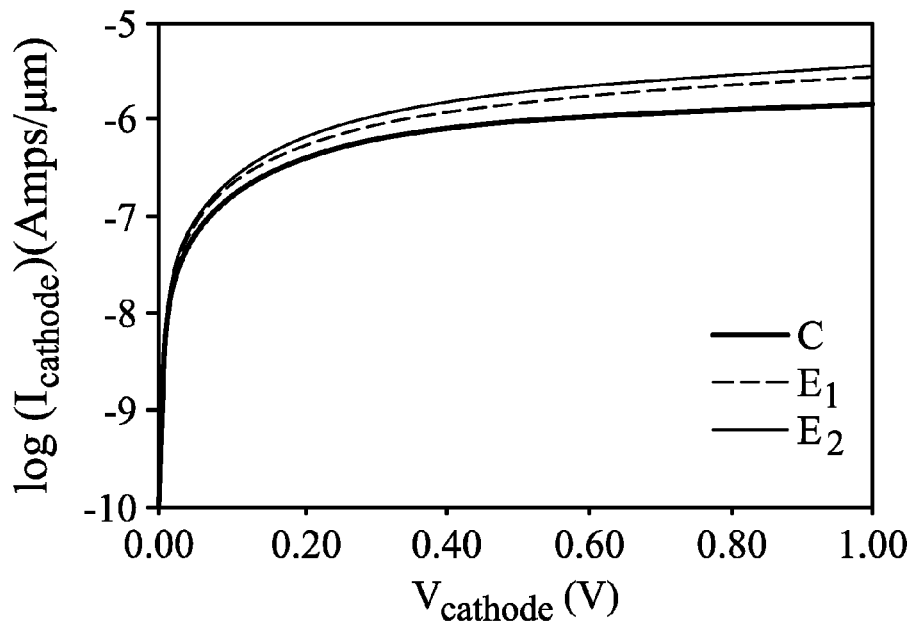
FIG. 3 shows results of forward current of a vertical diode with and without a bottom N-type implanted region.
Figure 4:
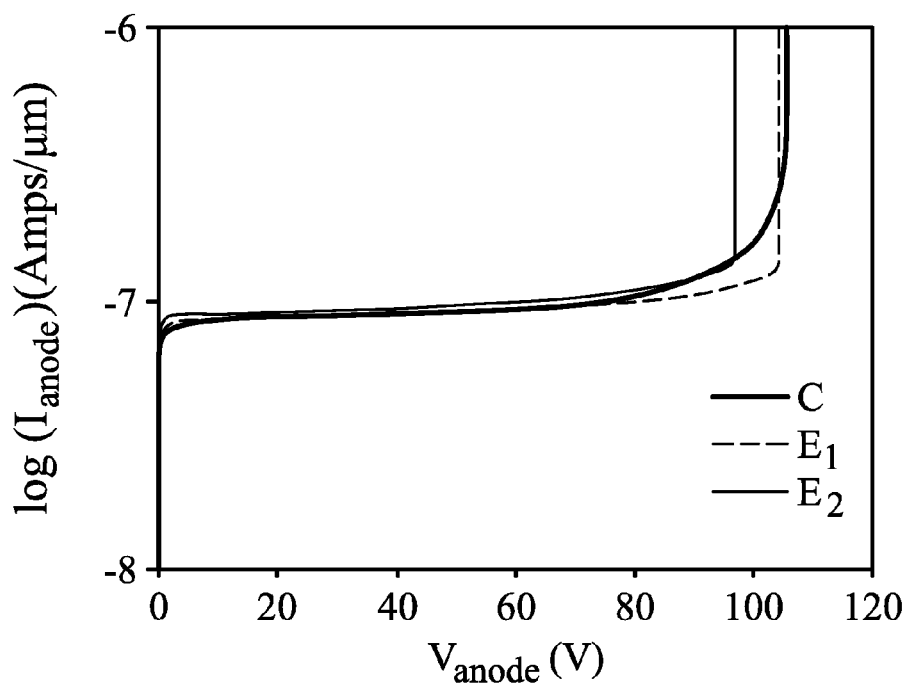
FIG. 4 shows results of breakdown voltage of a vertical diode with and without a bottom N-type implanted region.

FIG. 3 shows results of forward current of a vertical diode with and without a bottom N-type implanted region. FIG. 4 shows results of breakdown voltage of a vertical diode with and without a bottom N-type implanted region. In FIGS. 3 and 4, curve C shows results of forward current of the vertical diode without a bottom N-type implanted region. Curve E1 shows results of forward current of the vertical diode with a bottom N-type implanted region. For curve E1, the width W of the bottom N-type implanted region 104 is 1.25 times as great as the distance between the P-doped regions 112, and the N-type dopant concentration of the bottom N-type implanted region 104 is equal to the N-type dopant concentration of the high-voltage N-type well region 106. Curve E2 shows results of forward current of the vertical diode with a bottom N-type implanted region. For curve E2, the width W of the bottom N-type implanted region 104 is 1.5 times as great as the distance between the P-doped regions 112, and the N-type dopant concentration of the bottom N-type implanted region 104 is equal to the N-type dopant concentration of the high-voltage N-type well region 106.

Referring to FIG. 3, when the forward bias with 0.3 V is applied, the forward current $I_{F,C}$, $I_{F,E1}$, and $I_{F,E2}$ corresponding to the curve C, curve E1, and curve E2 are $5.3 \times 10^{-7}$ Amps/μm, $9.0 \times 10^{-7}$ Amps/μm, and $1.1 \times 10^{-6}$ Amps/μm, respectively. Therefore, in comparison with the vertical diode without a bottom N-type implanted region, the forward current of the vertical diode with a bottom N-type implanted region may be increased by 1.8-2 times.

Referring to FIG. 4, when the reverse bias is applied, the breakdown voltage $V_{B,C}$, $V_{B,E1}$, and $V_{B,E2}$ corresponding to the curve C, curve E1, and curve E2 are 104 V, 104 V, and 96 V, respectively. Accordingly, in comparison with the vertical diode without a bottom N-type implanted region, the breakdown voltage of the vertical diode with a bottom N-type implanted region may be reduced only by 0-7.6%.

The above experimental results prove that in comparison with the vertical diode without a bottom N-type implanted region, the forward current of the vertical diode may be increased by 1.8-2 times by forming the bottom N-type implanted region 104 and adjusting the size and the N-type dopant concentration of the bottom N-type implanted region 104. Furthermore, in such embodiments, the breakdown voltage of the vertical diode may be reduced only by 0-7.6%. Accordingly, the vertical diode of this disclosure has significantly increased forward current with a slight effect, or no effect, on the breakdown voltage. Therefore, the performance of the device is improved.

In some embodiments, the first, second, third, and fifth implantation processes may be different processes and independent to one another, and may independently use different N-type dopants. In some embodiments, the first, second, third, and fifth implantation processes may use the same N-type dopant. In particular, the first implantation for forming the bottom N-type implanted region 104 and the second implantation for forming the high-voltage N-type well region 106 may use the same N-type dopant. In such embodiments, only the N-type dopant concentration is adjusted without changing the process tools and material for implantation processes, and therefore the manufacture cost will not be increased.

In addition, in this embodiment, the substrate 102 is a P-type doped semiconductor substrate. In other embodiments, the substrate 102 may be an undoped substrate or an N-type doped semiconductor substrate. For ensuring the proper operation of the vertical diode 100, the dopant concentration of the bottom N-type implanted region 104, the high-voltage N-type well region 106, the N-type well region 108, the P-doped regions 112, and the N-type heavily doped region 114 may optionally be adjusted according to the conductive type of the substrate 102.

In other embodiments, the substrate 102 is an undoped silicon substrate, and the dopant concentration of the high-voltage N-type well region 106 is about $1\times10^{16}$-$5\times10^{17}$ atoms/cm$^3$; the dopant concentration of the bottom N-type implanted region 104 is 0.9-1.1 times as great as the dopant concentration of the high-voltage N-type well region 106; the dopant concentration of the N-type well region 108 is about $1\times10^{16}$-$5\times10^{18}$ atoms/cm$^3$; the dopant concentration of the P-doped regions 112 is about $1\times10^{16}$-$5\times10^{18}$ atoms/cm$^3$; and the dopant concentration of the N-type heavily doped region 114 is about $1\times10^{18}$-$1\times10^{20}$ atoms/cm$^3$.

In other embodiments, the substrate 102 is an N-type doped semiconductor substrate, and the dopant concentration of the high-voltage N-type well region 106 is about $1\times10^{16}$-$5\times10^{17}$ atoms/cm$^3$; the dopant concentration of the bottom N-type implanted region 104 is 0.9-1.1 times as great as the dopant concentration of the high-voltage N-type well region 106; the dopant concentration of the N-type well region 108 is about $1\times10^{16}$-$5\times10^{18}$ atoms/cm$^3$; the dopant concentration of the P-doped regions 112 is about $1\times10^{16}$-$5\times10^{18}$ atoms/cm$^3$; and the dopant concentration of the N-type heavily doped region 114 is about $1\times10^{18}$-$1\times10^{20}$ atoms/cm$^3$.

Figure 2A:
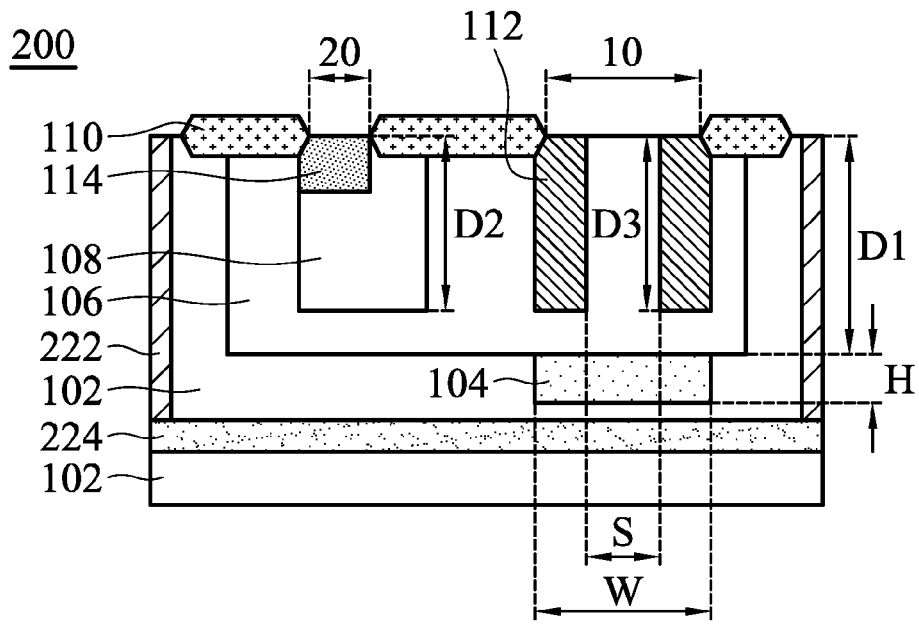
FIGS. 2A-2B show cross-sectional views of various stages of forming a vertical diode in accordance with other embodiments.
Figure 2B:
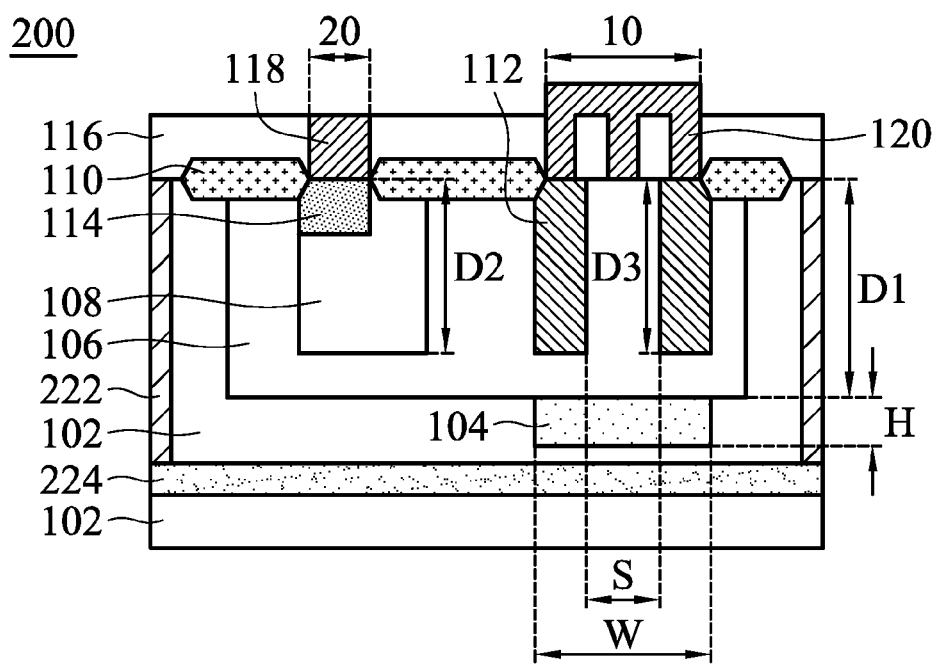

FIGS. 2A-2B show cross-sectional views of various stages of forming a vertical diode 200 in accordance with other embodiments. In FIGS. 2A-2B and FIGS. 1A-1G, the same reference numerals and/or letters refer to the same components. For the purpose of simplicity and clarity, these components shown in FIGS. 2A-2B and their formation method may be the same as or similar to those shown in FIGS. 1A-1G and the detailed will not be repeated here.

Referring to FIG. 2A, it is similar to FIG. 1E, and the difference is that FIG. 2A includes deep trench isolation (DTI) structure 222 and an insulating layer 224. As shown in FIG. 2A, the insulating layer 224 is under the bottom N-type implanted region 104. The deep trench isolation structure 222 is formed in the substrate 102 and surrounds the high-voltage N-type well region 106. The deep trench isolation structure 222 and the insulating layer 224 form an electrically insulated, enclosed region.

The insulating layer 224 may include nitride, oxynitride, buried oxide, or another applicable insulating material. In some embodiments, the insulating layer 224 may be formed before the bottom N-type implanted region 104 is formed. In this embodiment, the substrate 102 is silicon-on-insulator substrate, and the step for forming the insulating layer 224 may be omitted.

The deep trench isolation structure 222 may be formed before the dielectric layer 116 is formed. In other words, before the structure shown in FIG. 1F is formed, the deep trench isolation structure 222 may be formed before or after any one of the steps. The deep trench isolation structure 222 may be formed by any suitable process. For example, the processes for forming a deep trench isolation structure 222 may include performing dry etching to form deep trench in the substrate 102, filling the deep trench with suitable dielectric material or insulating material, and then removing the excess dielectric material over the substrate 102.

After the structure shown in FIG. 2A is formed, the processes described in FIGS. 1F-1G may be performed sequentially to form the vertical diode 200 as shown in FIG. 2B.

In this embodiment, the deep trench isolation structure 222 and the insulating layer 224 form an electrically insulated, enclosed region. Therefore, the noise from other outside components can be insulated, and the current from the vertical diode 200 is also insulated and would not interfere with other outside components. As a result, the vertical diode 200 and other outside components can operate independently, and therefore the overall performance of the device is improved.

The present disclosure provides a vertical diode and its fabrication method. The advantage of this disclosure is that the forward current can be significantly increased by forming an additional bottom N-type implanted region under the high-voltage N-type well region. Furthermore, by adjusting the size and the N-type dopant concentration of the bottom N-type implanted region, the vertical diode has a significantly increased forward current with a slight effect, or no effect, on the breakdown voltage. Therefore, the performance of the device is improved. Additionally, because the bottom N-type implanted region and the second implantation for forming the high-voltage N-type well region are formed by the same implantation processes with the same N-type dopant, the manufacturing cost will not increase. In addition, an electrically insulated, enclosed region is formed by the deep trench isolation structure and the insulating layer. As a result, the vertical diode and other outside components can operate independently, and therefore the overall performance of the device is improved.

Although the disclosure has been described by way of example and in terms of the preferred embodiments, it should be understood that various modifications and similar arrangements (as would be apparent to those skilled in the art) can be made herein without departing from the spirit and scope of the disclosure as defined by the appended claims.

What is claimed is:

1. A vertical diode, comprising:
    a substrate;
    a high-voltage N-type well region formed in the substrate, wherein the high-voltage N-type well region extends from a top surface of the substrate downward to a depth, and wherein the high-voltage N-type well region has a first N-type dopant concentration;
    two P-doped regions formed in the high-voltage N-type well region, wherein the P-doped regions are spaced apart from each other;
    an N-type well region formed in the high-voltage N-type well region, wherein the N-type well region has a second N-type dopant concentration that is higher than the first N-type dopant concentration;
    an N-type heavily doped region formed in the N-type well region, wherein the N-type heavily doped region has a third N-type dopant concentration that is higher than the second N-type dopant concentration;
    a plurality of isolation structures formed on the top surface of the substrate to define an anode region and a cathode region, wherein the anode region exposes the P-doped regions and the high-voltage N-type well region between the P-doped regions, and wherein the cathode region exposes the N-type heavily doped region;
    a bottom N-type implanted region formed under the high-voltage N-type well region corresponding to the anode region, wherein the bottom N-type implanted region directly contacts the high-voltage N-type well region;
    an anode electrode electrically connected to the P-doped regions and the high-voltage N-type well region between the P-doped regions;
    a cathode electrode electrically connected to the N-type heavily doped region; and
    wherein a height of the bottom N-type implanted region is 5-15% of the depth of the high-voltage N-type well region.

2. The vertical diode as claimed in claim 1, wherein a width of the bottom N-type implanted region is 0.5-2 times as great as a distance between the P-doped regions.

3. The vertical diode as claimed in claim 1, wherein a fourth N-type dopant concentration of the bottom N-type implanted region is 0.9-1.1 times as great as the first N-type dopant concentration of the high-voltage N-type well region.

4. The vertical diode as claimed in claim 1, wherein the substrate is a bulk semiconductor substrate.

5. The vertical diode as claimed in claim 1, wherein the substrate is a silicon-on-insulator substrate.

6. The vertical diode as claimed in claim 5, further comprising:
    an insulating layer under the bottom N-type implanted region; and
    a deep trench isolation structure formed in the substrate and surrounding the high-voltage N-type well region, wherein the deep trench isolation structure and the insulating layer form an electrically insulated, enclosed region.

7. The vertical diode as claimed in claim 1, wherein the substrate is a P-type semiconductor substrate.

8. The vertical diode as in claim 1, wherein the substrate is an N-type semiconductor substrate.

9. The vertical diode as claimed in claim 1, wherein the anode electrode and the cathode electrode independently comprise tungsten, copper, molybdenum, gold, silver, aluminum, platinum or an alloy thereof.

* * * * *